United States Patent [19]

August et al.

[11] Patent Number: 4,628,407
[45] Date of Patent: Dec. 9, 1986

[54] CIRCUIT MODULE WITH ENHANCED HEAT TRANSFER AND DISTRIBUTION

[75] Inventors: Melvin C. August; John T. Williams, both of Chippewa Falls, Wis.

[73] Assignee: Cray Research, Inc., Minneapolis, Minn.

[21] Appl. No.: 599,688

[22] Filed: Apr. 17, 1984

Related U.S. Application Data

[63] Continuation-in-part of Ser. No. 487,516, Apr. 22, 1983, Pat. No. 4,535,385.

[51] Int. Cl.[4] .............................................. H05K 7/20
[52] U.S. Cl. .................................. 361/388; 361/386; 361/414
[58] Field of Search .............................. 361/386–388, 361/414, 412; 357/81; 174/52 FP

[56] References Cited

U.S. PATENT DOCUMENTS

| | | | |
|---|---|---|---|
| 3,268,772 | 8/1966 | Kamei | 361/388 |
| 3,904,934 | 9/1975 | Martin | 361/412 |
| 4,054,939 | 10/1977 | Ammon | 361/414 |
| 4,120,021 | 10/1978 | Roush | 361/388 |
| 4,204,247 | 5/1980 | Wigley | 361/387 |
| 4,383,270 | 5/1983 | Schelhorn | 357/71 |

OTHER PUBLICATIONS

A. P. Mandel et al., "Heat Dissipator Assemblies", IBM Technical Disclosure Bulletin, Mar. 1966, vol. 8, No. 10.
C. S. K. Ng, "Circuit Module Package", IBM Technical Disclosure Bulletin, Feb. '79, vol. 21, No. 9, p. 3539.
M. J. Donegan, "Thermal Connection for Circuit Package", IBM Technical Disclosure Bulletin, vol. 13, No. 7, Dec. '70.
G. O. Tiffany, "Integrated Circuit Package and Heat Sink", IBM Technical Disclosure Bulletin, vol. 13, No. 1, Jun. '70.

Primary Examiner—A. D. Pellinen
Assistant Examiner—Gregory D. Thompson
Attorney, Agent, or Firm—Merchant, Gould, Smith, Edell, Welter & Schmidt

[57] ABSTRACT

A circuit module (10) having enhanced heat transfer and distribution characteristics which is particularly adapted for use in high speed electronic digital computers. The circuit module (10) includes a circuit board assembly (12) with a plurality of electronic devices (26) such as integrated circuits, mounted on a circuit board (28). The circuit board (28) includes conductive pads (42 and 44) and plated-through holes (46) forming a thermally conductive flow path from each electronic device (26) to the opposite side of the circuit board for more efficient heat transfer away from the module (10). The heat pads (42 and 44) and plated-through holes (46) are preferably connected with the ground plane layer (36) of the circuit board (28) for better heat distribution as well.

8 Claims, 11 Drawing Figures

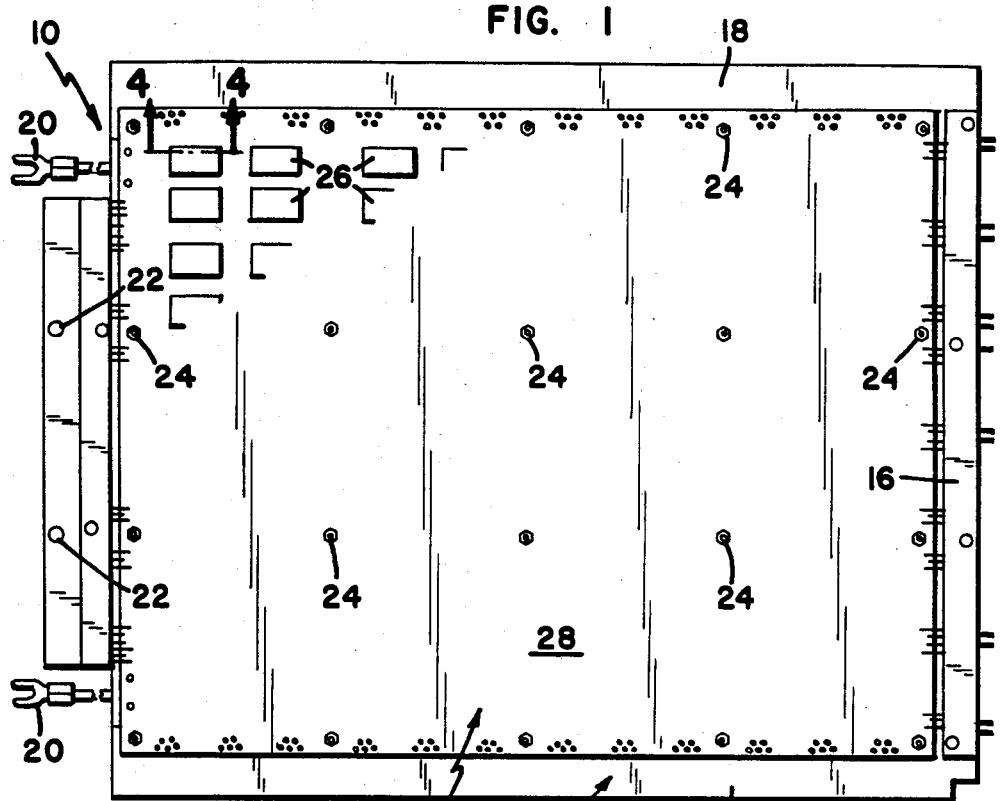
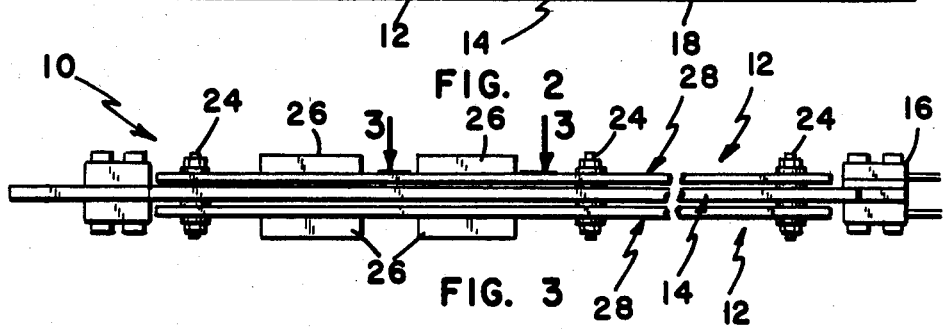
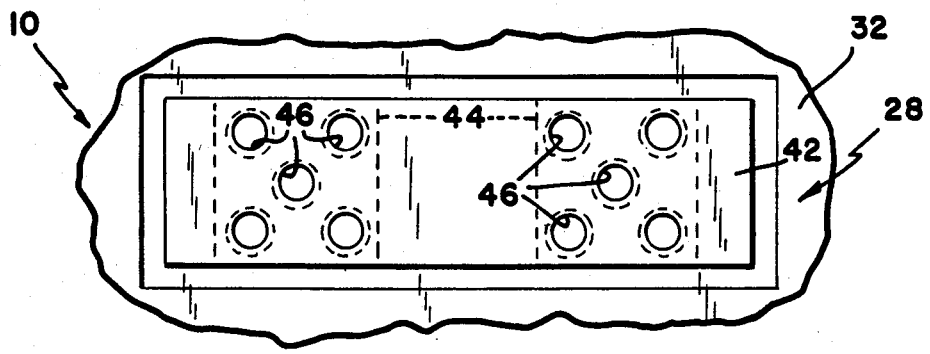

CIRCUIT MODULE WITH ENHANCED HEAT TRANSFER AND DISTRIBUTION

CROSS REFERENCE TO RELATED APPLICATION

This application is a continuation-in-part of co-pending application Ser. No. 06/487,516 filed Apr. 22, 1983, now U.S. Pat. No. 4,535,385.

TECHNICAL FIELD

The present invention relates generally to a circuit module adapted for provide better cooling capacity and efficiency, and more particularly to a circuit module incorporating a circuit board with thermally conductive flow paths interconnecting the electronic devices on one side of the board with locations on the other side of the board for more efficient heat transfer and distribution.

BACKGROUND ART

Electronic equipment during operation generates heat which must be dissipated to maintain the components and circuitry therein within predetermined design temperature limitations for proper performance. The provision of adequate cooling to electronic equipment is a recurrent design problem which has intensified with the use of integrated circuits and miniaturization of circuitry leading to greater circuit density and thus higher heat loads within smaller volumes. Cooling by forced air or even by circulation of liquid coolants often is inadequate.

The difficulties associated with adequate cooling in electronic equipment are particularly critical in the case of high speed electronic digital computers. Such computers are typically utilized in complex scientific or mathematic applications and are capable of performing millions of operations in a very short period of time. Computers of this type incorporate extensive circuitry and components are designed and selected primarily for high speed operation, rather than low heat dissipation. Short circuit distances are an important factor in the speed attainable for operations of this magnitude. As a result, high speed electronic digital computers tend to have especially high circuit densities and thus high heat loads, and the trend is toward machines of even greater capability.

U.S. Pat. No. 4,120,021 to Cray Research, the assignee hereof, shows a cooling system for electronic assemblies in a computer. In this system a pair of circuit board assemblies are located on opposite sides of a heat conducting plate which is secured between the slotted surfaces of refrigerated cooling bars. Heat transfer is primarily by radiation and convection across the minimum air gaps between the circuit board assemblies and the cooling plate, and to some small extent also by incidental conduction through the mechanical connectors. This system functions well and provides good cooling capacity sufficient for many computers, but it does not have adequate capacity to meet the cooling needs of the latest computers and it does not satisfactorily address the problem of heat distribution. Some devices on a circuit board dissipate more heat than others such that proper cooling requires sufficient heat transfer as well as distribution.

A need has thus arisen for an improved circuit module of better heat transfer and distribution capability.

SUMMARY OF INVENTION

The present invention comprises a circuit module which overcomes the foregoing and other difficulties associated with the prior art. In accordance with the invention, there is provided a circuit module with improved heat transfer and distribution capability. A circuit board assembly is disposed in predetermined spaced-apart relationship with a heat conducting plate to define a minimum air gap therebetween. The heat conducting plate is adapted for connection to refrigerated cooling bars comprising a portion of the chassis of the computer or other electronic equipment. The circuit board assembly includes a circuit board with electronic devices mounted thereon whose lead pins extend through the top of the board and are electrically connected to certain metallized conductive layers or circuit traces therein. Means are provided for defining a direct thermally conductive path from each device through the circuit board to locations in close proximity or contact with the cooling plate. In one embodiment, a first thermally conductive pad is disposed between the device and the board, while at least one and preferably two second pad are mounted on the opposite side of the board adjacent to the plate. The first and second pads include openings therein connected by vias extending through the circuit board which are lined and/or filled with suitable thermally conductive material in the manner of heat pipes in order to form thermal conduction paths from the electronic device through the circuit boards. Bumps can be formed on the second pads to improve heat transfer to the cooling plate. Bosses can be provided on the plate for contact with the second pads and/or bumps thereon for heat transfer to the plate. Another embodiment includes the use of separate plugs between the plate and second pads, or through the circuit board directly between the cooling plate and device.

BRIEF DESCRIPTION OF DRAWINGS

A better understanding of the invention can be had by reference to the following Detailed Description in conjunction with the accompanying Drawings, wherein:

FIG. 1 is a top view of a circuit module having improved heat transfer and distribution characteristics in accordance with the invention;

FIG. 2 is a side view of the circuit module;

FIG. 3 is an enlarged horizontal cross-sectional view taken along lines 3—3 of FIG. 2 in the direction of the arrows showing a first embodiment of the invention.

DETAILED DESCRIPTION

Figure 4:
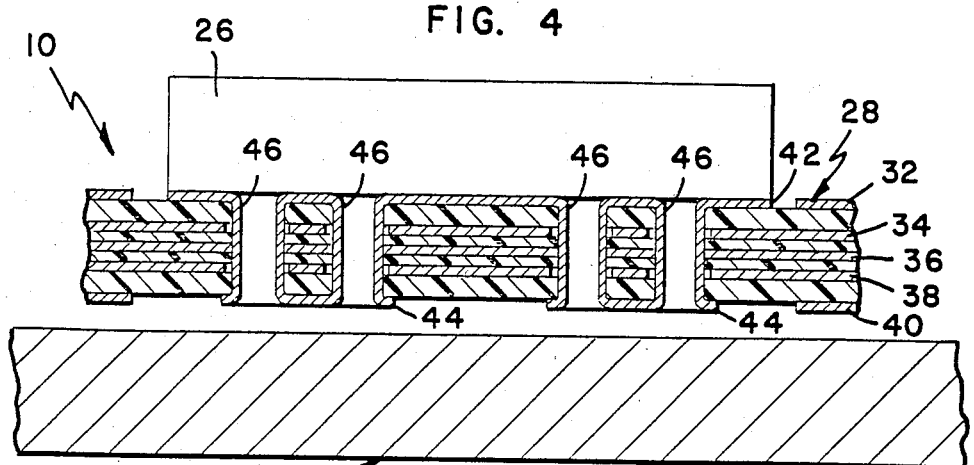
FIG. 4 is an enlarged vertical cross-sectional view taken along lines 4—4 of FIG. 1 in the direction of the arrows.

Referring now to the Drawings, wherein like reference numerals designate corresponding elements throughout the views, and particularly referring to FIGS. 1 and 2, there is shown the circuit module 10 of the invention. As will be explained more fully hereinafter, the circuit module 10 is particularly adapted to maximize heat transfer and distribution at minimal additional expense and complication in manufacture. Although the improved circuit module 10 herein is illustrated and described with reference to use in high speed electronic digital computers, it will be understood that the invention can also be applied to other types of electronic equipment.

The circuit modules 10 are arranged in the chassis of a computer (not shown) substantially like that shown in U.S. Pat. No. 4,120,021, the disclosure of which is incorporated herein by reference. Briefly, the chassis of the computer includes a plurality of upright refrigerated cooling bars (not shown) of generally wedge-shape arranged in circumferentially spaced apart relationship so that the upper portion of the computer chassis is of semi-cylindrical shape. The cooling bars extend radially outward like the spokes of a wheel with the center and one sector being left open for access to the inside of the chassis. A bank of circuit modules 10 are connected between each pair of cooling bars.

In particular, each circuit module 10 includes a pair of circuit board assemblies 12 arranged on opposite sides of a cooling plate 14. An electrical connector 16 is provided across the back end of the cooling plate 14 for connection to a mating connector on a mounting strip (not shown). The flanges 18 are provided on opposite lateral sides of the cooling plate 14 of each circuit module 10, with the flanges projecting beyond the associated circuit board assemblies 12 and being received within the slots formed in opposing surfaces of the adjacent cooling bars. A pair of lead wires 20 are provided on the front end of each circuit module 10 for supplying power voltages to the circuit board assemblies 12. A pair of finger holes 22 are provided in the front end of the cooling plate 14 to facilitate removal of the circuit module 10 from the computer for maintenance and the like.

Circuit board assemblies 12 are mounted in closely spaced relationship on opposite sides of the cooling plate 14 by means of a plurality of mechanical spacer/connectors 24 like those shown in the U.S. Pat. No. 4,120,021. The purpose of spacer/connectors 24 is to provide a controlled minimum spacing between the circuit board assemblies 12 and the cooling plate 14 for maximum heat transfer. Each circuit board assembly 12 comprises a plurality of electrical devices 26, such as integrated circuits or other components, mounted on a circuit board 28. A pair of electrical connectors (not shown) are also provided for connecting the power supply plane of the circuit board 28 of each module 12 with a bus assembly (not shown) to which the lead wires 20 are connected. The electrical devices 26 are located on the side of the circuit board 28 away from the associated cooling plate 14, and each device during operation generates heat which must be dissipated and controlled. As will be explained more fully hereinafter, the present invention facilitates more efficient transfer of the heat from the electrical devices 26 of each circuit board assembly 12 to the associated cooling plate 14 such that better heat distribution and higher cooling capacity are achieved.

Referring now to FIGS. 3 and 4 in conjunction with FIG. 2, the constructional details of the first embodiment of the invention can be seen. For purposes of clarity, only one circuit board assembly 12 together with the intermediate cooling plate 14 has been shown, however, it will be understood that both circuit board assemblies are constructed similarly. The electrical device 26 comprises an integrated circuit chip housed within a package having rows of lead pins (not shown) which extend through clearance holes and connect in conventional manner to the desired plane layer of the circuit board 28. As illustrated, the circuit board 28 includes five conductive plane layers 32, 34, 36, 38 and 40. Layer 36 is the ground plane while the other layers are signal planes defining particular circuit traces. Although the circuit board 28 is shown as being of multiplane construction, it will be understood that the heat transfer technique of the invention is best suited for such circuit boards but can be utilized with circuit boards of fewer or more layers.

The circuit board 28 includes a direct thermally conductive flow path between opposite sides thereof. As is best seen in FIGS. 3 and 4, a first heat sink pad 42 is provided within the top layer 32 between the electrical device 26 and the circuit board 28. The first heat sink pad 42 is of generally rectangular shape, coextensive with device 26, and is comprised of suitable thermally conductive material. For example, the pad 42 can comprise a 0.390 inch by 0.108 inch metallic layer photo-etched directly into the upper layer 32 by means of conventional printed circuit board assembly techniques. The first heat sink pad 42 is of course separated and thus electrically isolated from the rest of the circuit paths on layer 32.

A pair of second heat sink pads 44 are provided within the bottom plane layer 40 opposite the first pad 42. As illustrated, two pads 44 are provided in order to minimize blockage of circuit paths on layer 40, however, a larger single pad of similar shape and size as pad 42, could also be utilized. The second pair of heat sink pads 44 are also formed of thermally conductive material photo-etched directly into layer 40 in electrical isolation with the circuitry thereon. For example, each rectangular pad 66 can comprise a 0.091 inch by 0.108 inch metallic layer.

Each second pad 44 includes at least one, but preferably a plurailty of holes therein which register with "plated through holes" 46 extending through the circuit board 28 to corresponding holes in the first pad 42 to form a thermally conductive path between the pads. The plated through holes 46 are formed in conventional manner during lay-up of the circuit board 28 by drilling or otherwise providing vias through the pads 42 and 44 and layers 32-40 of the circuit board, and then plating the vias with copper to form a thermally conductive sleeve connecting pads 42 and 44. As illustrated, five openings and associated plated through holes 46 are provided between pad 42 and each second heat sink pad 44 although any suitable number can be utilized.

It will thus be appreciated that heat sink pads 42 and 44 together with the plated through holes 46 define a thermally conductive flow path from each electronic device 26 through the circuit board 28 to locations on the opposite side of the circuit board for transfer in a more efficient manner to the cooling plate 14. Heat transfer occurs by radiation and convection across the air gap between cooling plate 14 and the circuit board assembly 12. In the prior art, heat transfer occurred through the circuit board, however, such transfer was not as efficient because a direct conductive flow path was not provided between opposite sides of the circuit board. The provision of a direct conductive flow paths from electronic devices 26 through the circuit board 28 to locations on the opposite side of the circuit board in close proximity with the cooling plate 14 comprises a significant feature of the present invention which overcomes the deficiencies in the prior art and provides for superior cooling capacity.

In accordance with the preferred construction, each plated through hole 46 is connected to the ground plane layer 36 of the circuit board 28, as well as to pads 42 and 44. In addition to better heat transfer, better heat distribution results from this interconnection because all of the electrical devices 26 on circuit board 28 are tied together, both thermally and electrically, through the common ground plane layer 36. As is the case with pads 42 and 44 on layers 32 and 40, respectively, the plated through holes 46 are separated and thus electrically isolated from the signal plane layers 34 and 38, but connected to the ground plane layer 36. Interconnection of the heat sink pads 42 and 44 with the ground plane layer 36 comprises another significant feature of the invention in its preferred embodiment.

Figure 5:
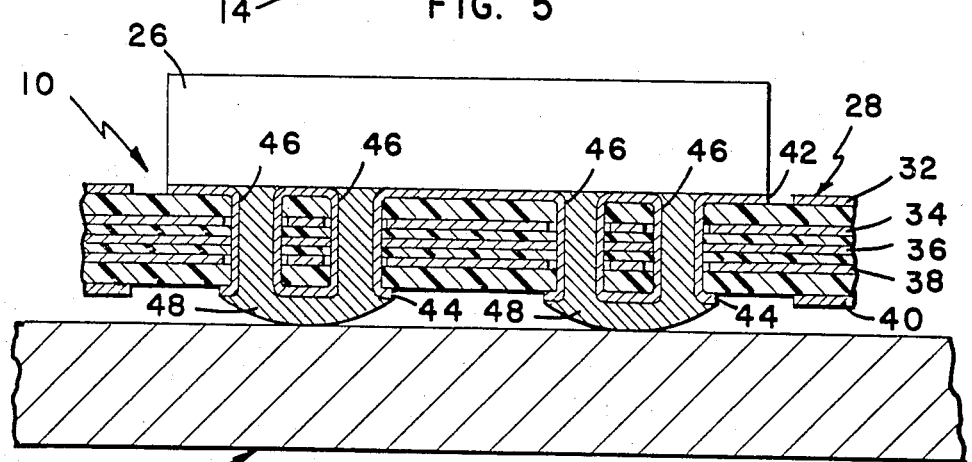
FIGS. 5, 6 and 7 are views similar to FIG. 4, but showing modifications of the first embodiment.
Figure 6:
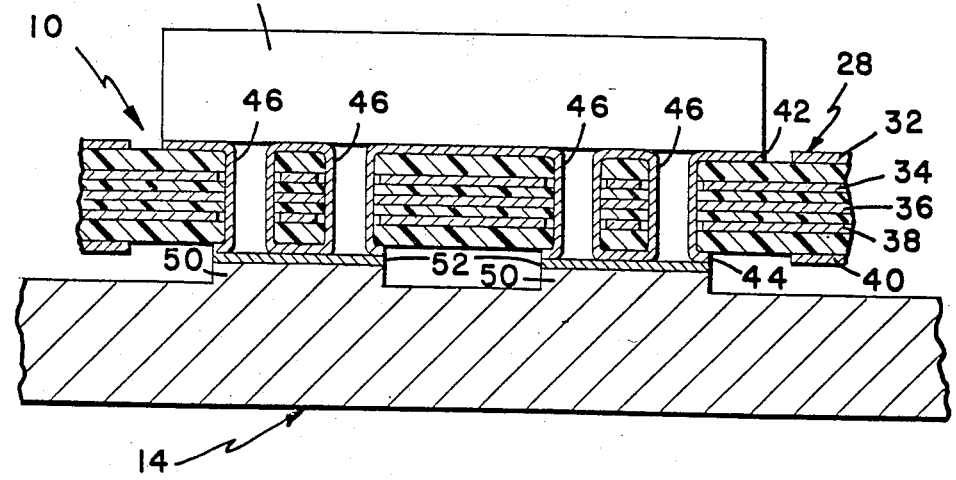
Figure 7:
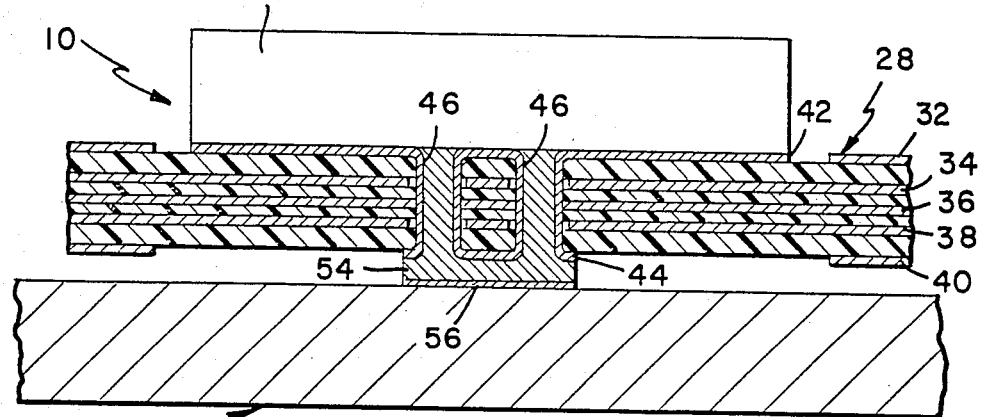

FIGS. 5, 6 and 7 illustrate modifications of the circuit module 10 of the first embodiment which are adapted to provide even more effective heat transfer from the electrical devices 26 to cooling plate 14. Common reference numerals have been utilized to designate the common elements in these modifications, each of which is shown in its preferred embodiment with the plated through holes 46 being connected to the ground plane layer 36 of the circuit board 28. It will be appreciated, however, that each of these modifications can be utilized either with or without connection of the ground plane layer 36 to the interconnected heat sink pads 42 and 44.

FIGS. 5–7 illustrate various means for establishing a direct conductive flow path on the second heat sink pads 44 and the cooling plate 14. In FIG. 5, beads or bumps 48 are provided on the second heat sink pads 44 for engagement with the cooling plate 14. The bumps 48 can be formed by flow or wave soldering the circuit board assembly 12 in the conventional manner such that the plated through holes 46 fill with solder which beads up and forms bumps 48 on the heat sink pads for all of the electronic devices 26 on circuit board 28. Bumps 48 can thus be formed simultaneously with soldering of all the various other connections on the circuit board 28, with no additional manufacturing steps. If any of the electrical devices 26 are not down tightly and snug against the circuit board 28, the solder will flow through the plated through holes 46 and fill any gaps between the electrical devices and the first heat sink pads 42 to establish good thermal contact.

FIG. 6 illustrates provision of raised bosses 50 on the cooling plate 14 for contacting the second heat sink pads 44 to establish direct conductive flow paths between the cooling plate and the electrical devices 26. A layer 52 of solder or thermal compound can be provided between each boss 50 and associated heat sink pad 44 to fill any slight gaps due to manufacturing variations and the like.

FIG. 7 illustrates provision of a conductive spacer or slug 54 connected directly to the second heat sink pad 44. Only one second heat sink pad 44 and associated first heat sink pad 42 have been shown in this particular modification, however, it will be understood that two second heat sink pads 44 and slugs can be utilized. The spacer or slug 54 can be formed of copper, brass, or other suitable conductive material. Again, a layer 56 of solder or thermal compound can be provided between the slug 54 and the cooling plate 14 to seal any slight gaps due to manufacturing variations and the like.

Figure 8:
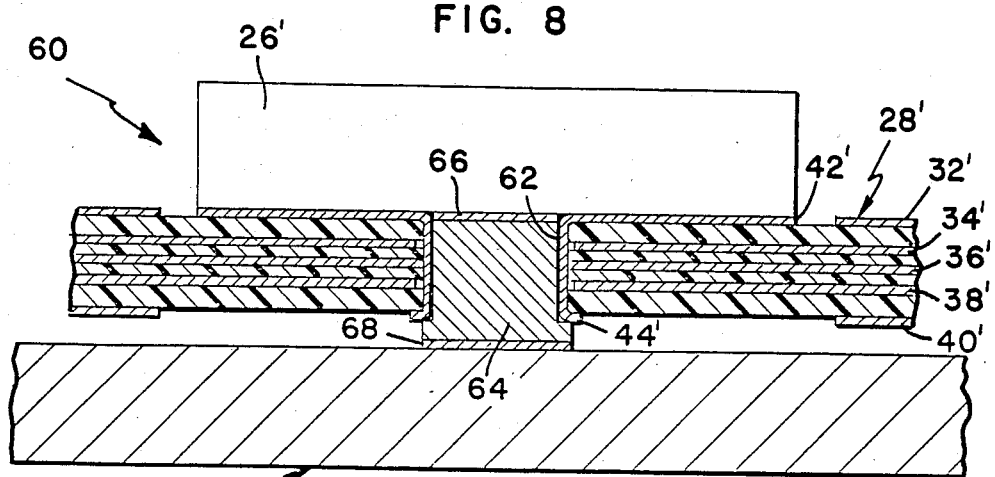
FIG. 8 is an enlarged vertical cross-sectional view showing a second embodiment of the invention.

Referring now to FIG. 8, there is shown a portion of a circuit module 60 representing a second embodiment of the invention. The circuit module 60 of the second embodiment incorporates many elements which are substantially identical in construction and function with elements of the first embodiment, circuit module 10. Such identical elements in the circuit module 60 have been identified with the same reference numerals as those in circuit module 10, but have been differentiated therefrom by means of prime (') designations.

The primary distinction between the two embodiments comprises the fact that the circuit module 60 includes at least on relatively large plated through hole 62, instead of several relatively smaller plated through holes 46, extending through the circuit board 28' and interconnecting the first heat sink pad 42' with at least one second heat sink pad 44'. The plated through hole 62 is formed similarly to holes 46 of module 10, and is preferably connected to the ground plane layer 36' of the circuit board 28'. A separate plug 64 is fitted within the plated through hole 62 for purposes of establishing a direct conductive flow path from the electrical device 26' to the cooling plate 14'. The plug 64 can be formed from copper, brass or other suitable thermally conductive material. If desired, layers 66 and 68 of solder or thermal compound can be provided for closing any slight gaps between the plug 64, electrical device 26' and cooling plate 14', due to manufacturing variations and the like.

Figure 9:
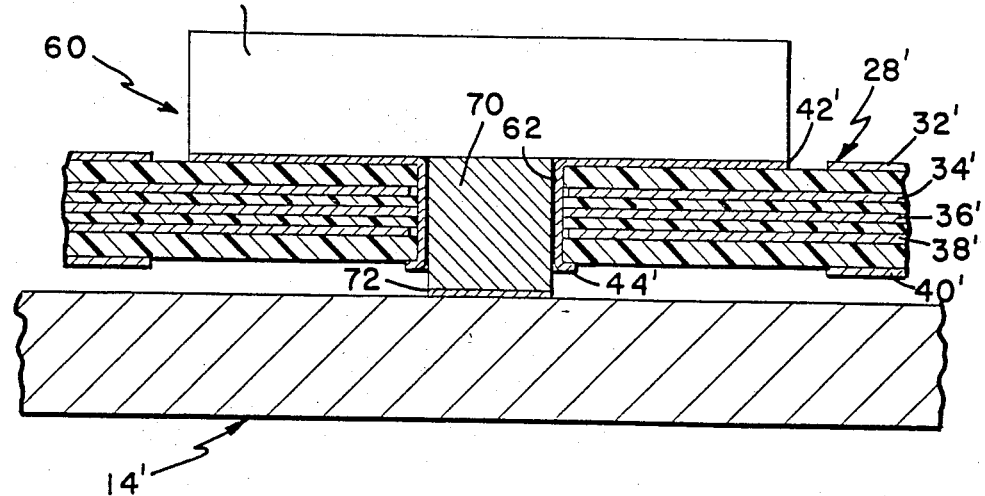
FIG. 9 is a view similar to FIG. 8, but showing a modification of the second embodiment.

FIG. 9 shows a modification of the circuit module 60, wherein an extension 70 is provided directly on the underside of the electrical device 26'. When the device 26' is mounted on the circuit board 28', the extension 70 fits through the plated hole 62 and engages the cooling plate 14'. Again, a layer 72 of solder or thermal compound can be provided between the lower end of extension 70 and the cooling plate 14' to close any slight gaps due to manufacturing variations and the like.

Figure 10:
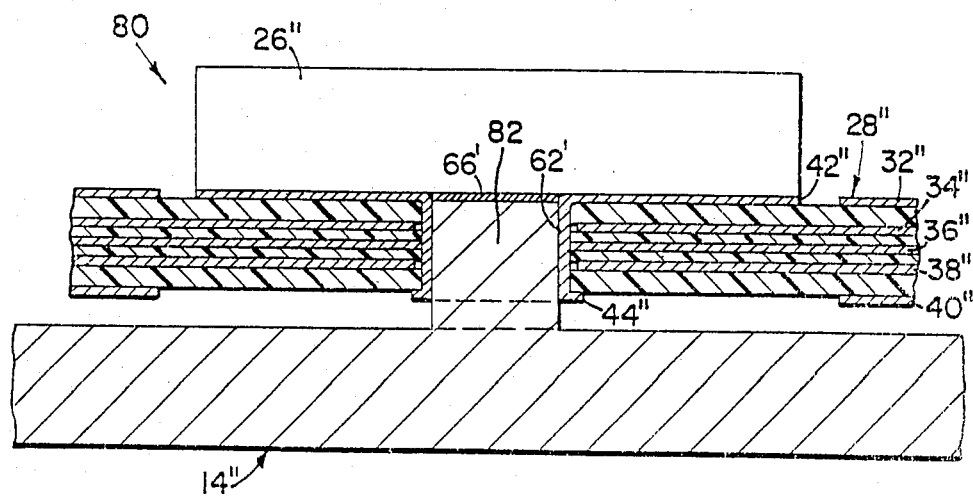
FIG. 10 is an enlarged vertical cross-sectional view showing a third embodiment of the invention.

Referring now to FIG. 10, there is shown a portion of circuit module 80 representing a third embodiment of the invention. The circuit module 80 of the third embodiment incorporates several elements which are substantially identical in construction and function with the elements of the second embodiment, circuit module 60. Such identical elements in the circuit module 80 have been identified with the same reference numerals as those in circuit module 60, but have been differentiated therefrom by means of prime (') or double prime (") designations as appropriate.

The primary distinction between the two embodiments comprises the fact that the circuit module 80 includes a raised boss or extension 82 formed as an integral portion of the cooling plate 14", instead of as a separate plug, for each electrical device 26". It is contemplated that rows of such extensions 82 would be formed in the cooling placte 14" by milling or other suitable techniques. The extension 82 is thus formed from the same material as the cooling plate 14", such as copper or the like. The extension 82 extends through the plated through hole 62' into engagement with the underside of the electrical device 26". If desired, a layer 66' of solder compound can be provided between the extension 82 and the electrical device 26" for purposes of closing any slight gaps due to manufacturing variations, in order to establish a good thermally comductive flow path; however, the bottom layer of solder or thermal compound, as can be used in the second embodiment, is of course not necessary in the third embodiment of the invention. The circuit module 80 may be most advantageous in those applications where the same or similar electrical devices 26" are utilized so that a common cooling plate 14" with uniform extension 82 can be employed. The circuit module 60 may be better suited for those applications incorporating various electrical devices 26' requiring different plugs and extensions 70.

Figure 11:
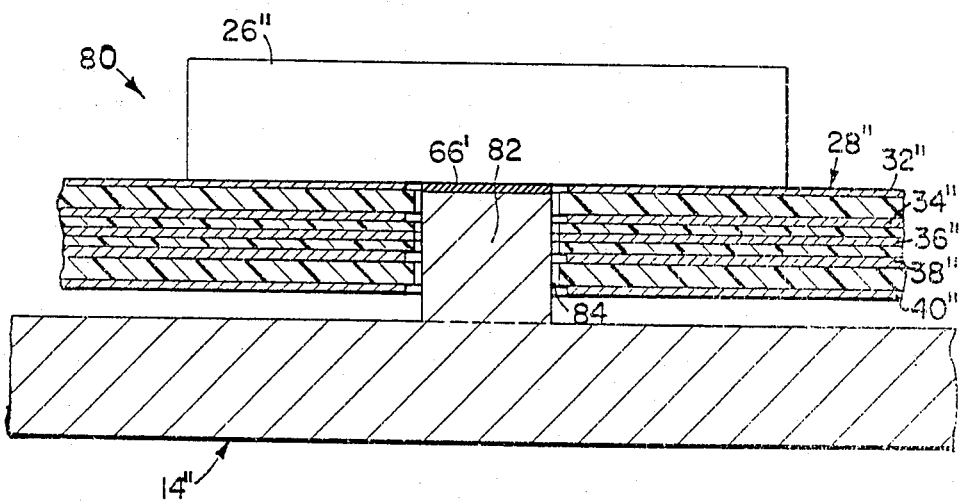
FIG. 11 is a view similar to FIG. 10, but showing a modification of the third embodiment.

FIG. 11 shows a modification of the circuit module 80 wherein the extension 82 extends through a hole 84 in the circuit board 28", which hole is not plated through as was shown in FIG. 10. The extension 82 is preferably spaced slightly inwardly away from the adjoining ends of the nonconductive layers of the circuit board 28", the conductive layers of which are spaced outwardly therefrom in electrical isolation. It will also be noted that the electrical device 26" in FIG. 11 is mounted directly on the top conductive plane layer 32", which extends to a point spaced inwardly from the non-plated through hole 84, instead of being mounted on a heat sink pad. Again, a layer 66' of solder or thermal compound can be provided between the top end of the integral extension 82 and the electrical device 26" to close any slight gaps due to manufacturing variations and the like, to form good thermally conductive flow path between the electrical device and the cooling plate 14".

From the foregoing, it will be apparent that the present invention comprises an improved circuit module having several advantages over the prior art. One significant advantage involves the fact that efficient thermally conductive flow paths are provided between the electronic devices and through the circuit board to the side adjacent to the cooling plate for better heat transfer. Another significant advantage involves the fact that the thermally conductive flow paths for all the electronic devices on each circuit board are connected to the ground plane layer within the circuit board, or a conductive plane on the top side of the circuit board, for better heat distribution. The enhanced heat transfer and distribution characteristics of the invention are uncomplicated, cost effective, and can easily be adapted to circuit boards during assembly with little or no extra manufacturing steps. Other advantages will be evident to those skilled in the art.

Although particular embodiments of the invention have been illustrated in the accompanying drawings and described in the foregoing detailed description, it will be understood that the invention is not limited to the embodiments disclosed, but is intended to embrace any alternatives, equivalents, modifications and/or rearrangements of elements falling within the scope of the invention as defined by the following claims.

What is claimed is:

1. A circuit module with enhanced heat transfer and distribution characteristics, comprising:
    a circuit board having top and bottom sides, and conductive signal plane and ground plane layers;
    a plurality of electronic devices mounted on the top side of said circuit board, each electronic device being located over at least one through-hole extending between the top and bottom sides of said circuit board;
    a cooling plate extending adjacent to the bottom side of said circuit board;
    means mechanically interconnecting said circuit board and said cooling plate in predetermined minimal spaced-apart relationship; and
    a first thermally-conductive pad engaged between each electronic device and the top side of said circuit board;
    said cooling plate including a plurality of integral extensions extending through the through-holes in said circuit board into engagement with said electronic devices, said extensions being isolated from the signal plane layers but connected to the ground plane layer of said circuit board so as to distribute heat from said electronic devices across said board while conducting heat through said board for transfer to said cooling plate.

2. The circuit module of claim 1, wherein said electronic devices comprise integrated circuit devices.

3. The circuit module of claim 1, further including:
    a second thermally-conductive pad disposed on the bottom side of said circuit board opposite each first pad; and
    thermally-conductive plating interconnecting each associated pair of first and second pads, the associated extension, and the ground plane layer of said circuit board.

4. The circuit board of claim 1, further including:
    a layer of thermally-conductive compound engaged between each extension and the associated electronic device.

5. A circuit module with enhanced heat transfer and distribution characteristics, comprising:
    a pair of circuit boards each having top and bottom sides, and conductive signal plane and ground plane layers;
    a plurality of electronic devices mounted on the top side of each circuit board;
    a cooling plate extending between said circuit boards;
    means mechanically interconnecting said circuit boards and said cooling plate in predetermined minimal spaced-apart relationship;
    a first thermally-conductive pad engaged between each electronic device and the top side of each circuit board;
    a second thermally-conductive pad disposed on the bottom side of each circuit board opposite each first pad; and
    at least one thermally-conductive plated-through hole interconnecting each associated pair of first and second pads;
    said cooling plate including a plurality of integral extensions extending through said plated-through holes and engaging both the associated electronic devices and said plated-through holes, said plated-through holes being isolated from the signal plane layers but connected to the ground plane layer of said circuit boards so as to distribute heat from said electronic devices across said boards while conducting heat through said boards for transfer to said cooling plate.

6. The circuit module of claim 5, further including:
    a layer of thermally conductive compound engaged between each extension and the associated electronic device.

7. A circuit module with enhanced heat transfer and distribution characteristics, comprising:
    a pair of circuit boards each having top and bottom sides, and conductive signal plane and ground plane layers;

a plurality of electronic devices mounted on the top side of each circuit board, each electronic device being located over at least one through-hole extending between the top and bottom sides of said circuit board;

a cooling plate extending between said circuit boards;

means mechanically interconnecting said circuit boards and said cooling plate in predetermined minimal spaced-apart relationship; and a conductive layer engaged between each electronic device and the top side of each circuit board, said conductive layers comprising said conductive signal plane layer on the top side of each circuit board;

said cooling plate including a plurality of integral extensions extending through the through-holes in said circuit board into engagement with said electronic devices, said extensions being isolated from the signal plane layers and the ground plane layer of said circuit boards, so as to distribute heat from said electronic devices across said boards while conducting heat through said boards for transfer to said cooling plate.

8. The circuit module of claim 7, further including:

a layer of thermally conductive compound engaged between each extension and the associated electronic device.

* * * * *